(12) United States Patent
Rogai

(10) Patent No.: US 8,072,348 B2
(45) Date of Patent: Dec. 6, 2011

(54) SYSTEM FOR THE REMOTE ACQUISITION OF THE ELECTRIC ENERGY CONSUMPTIONS AND FOR THE REMOTE CONTROL OF THE DISTRIBUTED TARGETS OF USERS, ALSO OF DOMESTIC TYPE

(75) Inventor: Sergio Rogai, Rome (IT)

(73) Assignee: Enel Distribuzione S.p.A., Rome (IT)

( * ) Notice: Subject to any disclaimer, the term of this patent is extended or adjusted under 35 U.S.C. 154(b) by 1144 days.

(21) Appl. No.: 11/808,822

(22) Filed: Jun. 13, 2007

(65) Prior Publication Data

US 2008/0042874 A1 Feb. 21, 2008

Related U.S. Application Data

(62) Division of application No. 10/499,691, filed as application No. PCT/EP02/14687 on Dec. 20, 2002, now Pat. No. 7,271,735.

(30) Foreign Application Priority Data

Dec. 20, 2001 (IT) .............................. MI2001A2726

(51) Int. Cl.
*G08C 19/16* (2006.01)
(52) U.S. Cl. ................ 340/870.02; 340/870.11; 324/74; 324/110
(58) Field of Classification Search ............. 340/870.02, 340/870.11, 310.01; 324/74, 110
See application file for complete search history.

(56) References Cited

U.S. PATENT DOCUMENTS

| | | | |
|---|---|---|---|
| 4,427,968 A | 1/1984 | York | |
| 4,638,298 A | 1/1987 | Spiro | |
| 4,803,632 A | 2/1989 | Frew et al. | |
| 5,216,623 A | 6/1993 | Barrett et al. | |
| 5,239,584 A | 8/1993 | Hershey et al. | |

(Continued)

FOREIGN PATENT DOCUMENTS

DE 0878892 11/1998

(Continued)

OTHER PUBLICATIONS

European Search Report dated May 17, 2005 in corresponding European Application No. 05006537.

(Continued)

*Primary Examiner* — Timothy Edwards, Jr.
(74) *Attorney, Agent, or Firm* — Nixon & Vanderhye P.C.

(57) ABSTRACT

A system for the remote acquisition of data and for the remote control of electricity meters comprises a central server AMM in bi-directional communication with a plurality of concentrators. To each concentrator, a set of electricity meters is connected, such that bi-directional communication between each meter and its associated concentrator is possible. The intelligence of the system is distributed between the central server, the concentrators and the electricity meters. To this end, each meter comprises at least a first processor, a first data memory and a first program memory for bi-directional communication with the associated concentrator. The first data memory serves to at least temporarily store and/or transmit the data which have already undergone a first processing by the first processor. Each of the concentrators comprises a second processor, a second program memory and a second data memory as well as means for a bi-directional communication with a central server. The second data memory serves to temporarily store and/or transmit the data processed by the second processor.

6 Claims, 1 Drawing Sheet

U.S. PATENT DOCUMENTS

Figure 1:
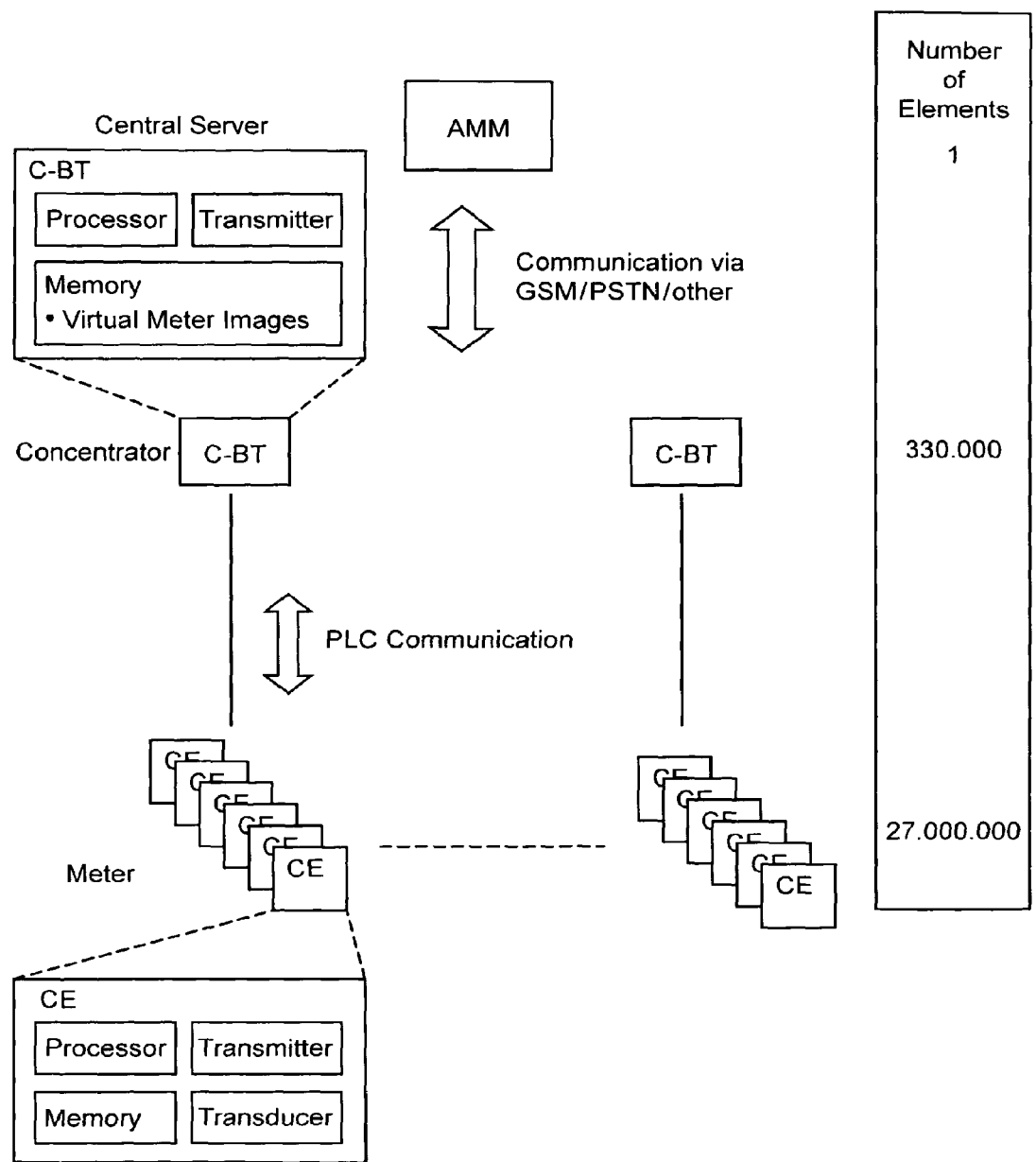

| | | |
|---|---|---|
| 5,311,068 A | 5/1994 | Miller |
| 5,467,286 A | 11/1995 | Pyle et al. |
| 5,548,527 A | 8/1996 | Hemminger et al. |
| 5,631,554 A | 5/1997 | Briese et al. |
| 5,786,683 A | 7/1998 | Williams |
| 5,892,758 A | 4/1999 | Argyroudis |
| 5,933,092 A | 8/1999 | Ouellette et al. |
| 5,986,574 A | 11/1999 | Colton |
| 6,100,817 A | 8/2000 | Mason, Jr. et al. |
| 6,195,018 B1 | 2/2001 | Ragle et al. |
| 6,236,197 B1 | 5/2001 | Holdsclaw et al. |
| 6,249,516 B1 | 6/2001 | Brownrigg et al. |
| 6,327,541 B1 | 12/2001 | Pitchford |
| 6,538,577 B1 * | 3/2003 | Ehrke et al. ............... 340/870.02 |
| 6,618,709 B1 * | 9/2003 | Sneeringer .................... 705/412 |
| 6,738,693 B2 * | 5/2004 | Anderson .................... 700/291 |
| 6,885,309 B1 | 4/2005 | Van Heteren et al. |
| 7,046,682 B2 | 5/2006 | Carpenter et al. |

FOREIGN PATENT DOCUMENTS

| | | |
|---|---|---|
| DE | 1087211 | 3/2001 |
| EP | 0 723 358 | 7/1996 |
| RU | 2140654 | 10/1999 |
| WO | 98/10299 | 3/1998 |
| WO | 98/10394 | 3/1998 |
| WO | WO 99/46564 | 1/1999 |

OTHER PUBLICATIONS

U.S. Appl. No. 10/499,691, filed Jul. 28, 2004, Rogai, S.

* cited by examiner

US 8,072,348 B2

SYSTEM FOR THE REMOTE ACQUISITION OF THE ELECTRIC ENERGY CONSUMPTIONS AND FOR THE REMOTE CONTROL OF THE DISTRIBUTED TARGETS OF USERS, ALSO OF DOMESTIC TYPE

This application is a divisional of U.S. application Ser. No. 10/499,691, filed on Jul. 28, 2004, (now U.S. Pat. No. 7,271, 735), which is the U.S. national phase of international application PCT/EP02/14687 filed 20 Dec. 2002, which designated the U.S. PCT/EP02/14687 claims priority to IT Application No. MI2001A002726 filed 20 Dec. 2001. The entire contents of these applications are incorporated herein by reference.

The technology described in this application applies in particular to the field of electric energy distribution to a plurality of users spread over the territory; but, more generally, it can also be applied to other services, as for example the distribution of water and gas, or for district heating.

The technology described in this application satisfies the requirement—which has arisen since a few years on a worldwide basis, especially in the technically more developed countries—to carry out the remote reading of the electric energy consumptions and, if desired, to apply different rates when invoicing the users, also of domestic type. A problem of this type has already been described, for example, in the Italian Patent No. 1.232.195, filed on 26 Oct. 1988 by the same Applicant, or in the document U.S. Pat. No. 4,803,632.

This requirement has arisen, and has increasingly developed, not only due to economical reasons, but also due to the need to establish further transparency and efficiency in the contractual relationships with the customers, in a market which is progressively getting more and more liberalized.

In this background, supported by the technological evolutions in the field of componentry technology, a certain number of technical solutions, systems or methodologies have been proposed, which intend to solve the problems connected with this situation.

The approach which associates these different studies can be summed up in a network which makes use of varied forms of communication to put into contact the peripheral points of the system (electricity meters in the targets of the users) with a supervision unit designed to conduct the procedures deemed helpful, time after time, to reach the intended objects.

Said contact is obtained through a direct communication between the supervision unit (generally a server with a high processing power) and the peripheral electricity meters, as described for example in WO-98/10299, or by interposing in this pyramid at least an intermediate hierarchic level, as proposed in WO-98/10394. Examples of these proposals can also be found in other patents, for example EP-A2-0.723.358 or WO-99/46564.

Nevertheless, the greatest majority of these projects has very often remained at the stage of purely unrealistic attempts or laboratory achievements, while the few proposals which have evolved up to reaching the level of an industrial type achievement have reached no appreciable results in terms of diffusion and use. The reasons for which such proposals have found no application on a vast scale lie in the fact that the industrial products obtained are not apt to guarantee the required performances when applied to situations involving a very high number of targets of users, as it generally happens in the case of electric energy consumptions.

A main object is therefore to propose a system allowing, on one hand, the remote acquisition of data from the targets of users and, on the other hand, also the remote control of such targets, so as to be able to satisfy the present requirements of all those companies which—like the companies distributing electric energy, water, gas and the like—operate in the presence of a high number of targets of users spread over the territory. To give an indication as to what is meant by "a high number of targets of users" it can be recalled that the company ENEL (National Company for Electric Energy) deals at present with about thirty million targets of users.

A further object is to propose a system apt to guarantee both a regular and continuous working, and a capacity of survival also in the case of blackouts of any type.

These objects are reached with a system making use of a single operating unit connected to the targets of users through a plurality of intermediate stations.

Further characteristics and advantages will anyhow result more evident from the following detailed description of a preferred embodiment thereof, given by mere way of non-limiting example and partially illustrated on the accompanying drawing:

FIG. 1 shows a diagram of a system for supervising and controlling a large number of distributed electricity meters.

The system in FIG. 1 substantially represents the set-up of the Italian territory at the priority filing date of the present patent application and supervises and controls about twenty-seven million electricity meters distributed over the whole territory. It is anyhow understood that this diagram merely represents an example and that it should in no way be considered as limiting.

Thus, according to a first aspect of the technology described in this application, such a vast set-up as that illustrated on the drawing, is obtained, on the one hand, by distributing the electricity meters CE according to area units Al . . . An and connecting the meters of each unit to a respective common concentrator C-BT1 . . . C-BTn. Each of said units Al . . . An comprises a limited number of electricity meters CE; by the term "limited" is meant a relatively small number of meters CE, preferably between 50 and 300, determined by the vastness of the territory or area served thereby, or by other factors, also commercial, connected with the territory taken into consideration;

on the other hand, by distributing a plurality of said concentrators C-BT1 . . . C-BTn over the whole territory being served, and by then connecting such concentrators to a single central server AMM. By the term "plurality" is here meant a number higher—by at least one, but also by two orders of magnitude—than the number of electricity meters CE of a unit, for example a number higher than 100,000 concentrators, in the case being illustrated 330.000 concentrators.

According to a characteristic of the technology described in this application, once a network of this type has been created, one provides not to concentrate the processing capacity, namely the intelligence of the system, merely in the central server AMM—as substantially done in prior art—but to distribute it between the three aforementioned components, namely the central server AMM, the concentrators C-BT1 . . . C-BTn, and the electricity meters CE. The principle adopted for this distribution is what allows to find the way for the communication lines to no longer have to transmit a considerable amount of data to be processed, but only a reduced amount of data, which has already been at least partially processed.

Substantially, to allow a system involving such high numbers and functional performances as those illustrated to work efficiently, with no delays and without any jams, the technology described in this application proposes to adopt the principle of distributing the processing power as far as it is reasonable from the economical point of view—as much as possible onto the peripheral units CE and on the concentrators C-BT1 ... C-BTn, to such an extent as to make such units as autonomous as possible (even acting in "stand-alone" conditions in case of interruption on the communication lines, or giving up part of the functional performances, if necessary). By acting in this way, it has been achieved to weigh as less as possible on the communication systems, by actually transferring merely the "processed data", rather than the entire amount of elementary data, and thereby obtaining some important results, such as:

a simplification of the processings required for the central server;

a reduced communication load;

the availability of considerable amounts of useful band for the purpose of supporting any eventual additional services.

The principle that has lead to the achievement of the technology described in this application may find its origin in the fact of having reproduced a virtual (but totally faithful) image of the electricity meter CE inside the concentrator C-BT. Virtually, it is as if in the concentrator there existed an "alias" of the electricity meter, which is continuously updated by the concentrator in a predetermined manner, by withdrawing data from the actual electricity meter (such data being processed autonomously or following controls being received). This image electricity meter is thus, in actual fact, constantly available on the concentrator for the transactions and the exchange of data, or for receiving controls and/or programs from the server.

This set-up allows furthermore to use in "stand-alone" conditions both the single electricity meter CE and the area units A1 ... An formed by the single concentrator C-BT and by the electricity meters CE of the area unit controlled thereby; thus, without the supervision of the server in real time but, for example, through a periodic reading of the data from the concentrator by means of a portable terminal.

To obtain this result, a further structural feature of the system thus formed lies in the fact that each of the meters CE incorporates, as well as means to measure the power consumptions, substantially known per se, also means to transduce the measured values into measuring data meant to be processed, at least a first processor to process said measuring data, at least a first data memory and a first programme memory, and first means for the bi-directional transmission towards the associated concentrator, the output of said first processor being connected to said first data memory and/or to said first bi-directional transmission means, so as to at least temporarily store and/or respectively transmit the data, which has already undergone a first processing.

Likewise, each concentrator incorporates at least a second programme memory, at least a second microprocessor for further processing said data processed by the meters, at least a second data memory to store the data issued by said meters and/or by said second microprocessor, and second means for the bi-directional transmission towards the central server, the output of said second processor being connected to said second data memory and/or to said second bi-directional transmission means, so as to at least temporarily store and/or respectively transmit said further processed data.

The connection, for the transmission of data, between the meters CE and the concentrators C-BT is preferably obtained through wave transmission systems, using the same power supply conductors that connect the meters CE to the low voltage power supply substations, e.g. the secondary substations, where the concentrators C-BT are positioned. Whereas, the connection between the concentrators C-BT1 ... C-BTn and the central server AMM is obtained, by preference, through a telephone network, whether it is a specific or a general-purpose network. A very suitable telephone network for this purpose would be the GSM or any other public mobile telephone network or any other existing wireless public telephone network, e.g., a satellite based wireless telephone network. If such a network is employed, it is advantageous to establish dial up connections between the concentrator C-BT and the central server AMM on demand or according to a schedule which can be predefined or dependent on an operating condition of the concentrator C-BT or the central server AMM.

If a predefined schedule is adopted, the AMM or the C-BT will try to establish a connection between the AMM and the C-BT at predetermined times during a day, week or month, at which times it can be assumed that a certain amount of data or commands which require to be transmitted, has been collected and buffered in the concentrator and/or in the AMM, respectively. If the schedule is dependent on an operating condition of the AMM and/or the C-BT, a dial up connection will be established as soon as a certain amount of data and/or commands which require transmission, have been collected or if certain alarm conditions have been detected which require to be reported without delay. In any case, after the data and/or commands have been transmitted, the connection is terminated.

With a structure of the system thus conceived, the respective measuring—which also forms an important characteristic of the present invention—ends up by being strictly tied to the functions which each of the three components of the system should perform.

In particular, each electricity meter of the system is dimensioned so that said first processor incorporated therein is apt to perform at least the functions of: (1) acquisition of the electric energy consumptions, (5) distribution of the power consumptions into different scales of charges, (12) estimate of the tampering attempts and control of an antifraud device, (25) transfer and maintenance of the stored data at least during the voltage drop.

Likewise, each concentrator of the system is dimensioned so that said second processor incorporated therein is apt to perform, as well as the double function of master of the PLC (power line carrier) network, for what concerns the communications on the power supply line between the actual concentrator and the electricity meters and, respectively, of node of the TLC network, for what concerns the communications on the telephone line between the concentrator and the central server, at least the following additional functions: (11) execution of an energy balance for what concerns the single cabin of electric energy supply into which the concentrator is positioned, (14) constant monitoring of the working conditions of each electricity meter connected thereto and issue of an alarm signal in case the self-diagnostics of the meter should indicate a malfunction.

Finally, the server or central unit of the system is dimensioned so that its processor is apt to guarantee at least the following functions: (8) automatic control of the operations of disconnection, reconnection, suspension, delayed payments and contract variations, (10) selective cut-off of the power supply due to requirements of the electric system, and (26) downloading of the operating programs.

A more complete list—to be however considered as a non-limiting example—of the functions which the system is apt to perform, can be summed up in the following points, wherein an initial brief definition is followed by a more detailed explanation of the function connected therewith:

1. Measurement and acquisition of the electric energy consumptions. The known type electromechanical electricity meters, adopted in the present power consumption system, are apt to measure only one type of electric energy consumption, active or reactive; if both measurements are required, it is hence necessary to install two distinct electricity meters. The electronic electricity meter according to the present invention is instead apt to simultaneously measure both the active energy consumptions and the reactive energy consumptions.

2. Accuracy rating. According to standards, the electricity meter measures in class 1 for the active energy and in class 2 for the reactive energy.

3. Acquisition and registration of the consumptions profile. For each user it is possible to detect the charging curve, with a programmable integration period, particularly in the range from 1 minute to 1 hour. Thanks to the processing capacity of the electricity meter it is possible to reckon the elapse of consecutive time intervals and, for each of them, to memorize the power consumption inside the same.

4. Measurement and recording of the average and peak power. The electromechanical electricity meters normally used in the power consumption system are apt to measure only one type of power, active or reactive; if both measurements are required, it is hence necessary to install two electricity meters, as already mentioned for the electric energy consumptions. The electronic electricity meter instead apt to simultaneously measure both the active power and the reactive power.

5. Distribution of the electric energy consumptions into different scales of charges. Thanks to its processing capacity, the electricity meter is apt to establish a table of different time scales in the space of a day, thereby making it possible to set out for each of them a respective cost value for the electric energy used up. The electricity meter is thus apt to integrate the consumptions with reference to the table of costs and to memorize, in the invoicing period, the total consumption of each time scale. In addition to this, said table of costs can be programmed not only on the basis of time profiles but also on the basis of power thresholds.

6. Control of several invoicing periods. It is possible to control at least two invoicing periods (present and previous), also at variable intervals.

7. Control of two electric energy supply contracts. In the power range up to 35 kw, it is possible to control two electric energy supply contracts, namely an existing contract and the one to be applied in future. The electricity meter can be programmed to automatically switch over the contract—from the present one to the future one—upon reaching of a given date.

8. Control of the operations of disconnection and reconnection. These operations can be carried out automatically in relation to situations of discontinuance, suspension for delayed payments, contract variations. Thanks to its processing capacity, the electricity meter carries out these operations on the basis of remote controls (from the central server or from the respective concentrator) through the PLC network. It is hence not necessary for an operator to physically go on the site where the electricity meter is installed.

9. Possibility to operate in conditions of prepayment. The electricity meter can be programmed so as to compare the amount of electric energy used up with a preset limit (eventually apt to be modified by an external control) corresponding to a payment carried out in advance; as soon as said limit has been exceeded, the electric energy supply is automatically disconnected and suspended.

10. Selective cut-off for requirements of the electric system. The cut-off or suspension of the power supply can be necessary, generally on a local level, in case of blackout risks or of temporary overloads. This function is not implemented in a broadcast mode, but it is instead specifically addressed to each single electricity meter. From the centre (central server or concentrator) it is possible to send to the electricity meters, via PLC, a control for example to modify the highest power available in the actual meter, with a temporary effect, that is with no need to alter the power supply contract; this allows to obtain a lightening of the overall power required from the cabin.

11. Execution of an energy balance. At the level of a single cabin, or of a single concentrator, it is possible to do the sum of the measurements of the power consumption drawn from the single electricity meters depending from said cabin. This sum—periodically compared to the value of the total electric current withdrawn, or with the mean electric current value—supplies a useful indication to detect any non-standard electric current withdrawals and, therefore, also any unauthorized withdrawals.

12. Antifraud/tampering function. At the level of each electricity meter, a device is provided to perform this specific function, which is thus apt to eliminate the requirement to use seals and to periodically check the integrity of such seals. The change of power, available by contract, does not require—as said—to open the electricity meter in order to adjust the measuring equipment (shunt); it has thus been possible to realize the electricity meter as a sealed single block structure containing all the functions of measurement, control of the contracts, control of the opening/closing circuit of the power line. For the purpose of checking any possible attempts to open the sealed structure in the electricity meter, an electromechanical device has thus been incorporated which produces an alarm signal on the network of the system and said alarm signal can be removed only by adopting a procedure available to the operators.

13. Measuring and recording quality parameters of the service. The microprocessor incorporated in each electricity meter is apt to verify and memorize interruptions of electric energy supply and voltage variations (deviation of the voltage from the nominal value foreseen in the electric energy supply contract). On the basis of this data, it is possible to determine the quality parameters of the service at the level of each delivery point of the electric energy being supplied.

14. Constant monitoring of the working conditions. The microprocessor incorporated in each electricity meter is apt to periodically verify (self-diagnostics) the conditions of the various hardware components of said meter and the congruency of the data stored in the memory. In case there should be any malfunctions, it is possible both to signal the same with appropriate service words (which are then read by the central system), and to start immediate recovery procedures.

15. Possibility of bi-directional transmission of information. The system allows not only to carry out operations directly connected to the supply of the service for which the system has been conceived, but also to send to the electricity meter and receive from the same other types of information ("information provider" service). The electricity meter can display such information on its own visual display unit, or else transfer it onto other devices connected to the electric line of the user, downstream of the electricity meter, or even draw it therefrom; such devices are directly interfaced with the electricity meter via PLC, or else through a bridge-device acting as an intermediate bridge and communicating directly with the electricity meter via PLC. This gives the possibility to other subjects to use the system as a remote control system allowing to connect oneself to ones own devices at the user's site.

16. Management of a calendar clock. Having allocated to the meter the calculation of consumptions as a function of the scale of charges, said meter requires a precise time reference (±30 sec/month); this is obtained by means of local electronic circuitry (RealTimeClock), the state of which may be remotely verified and synchronised (through external controls, via PLC or optical gate ZVEI) and corrected, if need be, in case of excessive variations.

17. Set of displayable data. On the local display of the meter (for example of the 16×1 alphanumeric+icons type), a whole series of data may be programmed. The presence of electronic components allows to provide additional functions such as locally displaying to the user consumptions and costs data, generic messages or messages providing information about the service, or indicating the functional state of said meter to the service staff (diagnostics).

18. Opening the power circuit. A modular element equipped with a suitable releasing element apt to be opened by remote control is integrated into the meter. A single box hosts both the electronic components apt to perform the meter functions described so far, and the electromechanical components apt to open/close the electrical power line. This way, the electromechanical components, besides operating autonomously at the highest power, may also be directed on request of the central unit or in the presence of local conditions detected by the electronic part (e.g. when the contract expires).

19. Quick installation of the meter. Having to replace a high number of devices at users' locations in a short time, the technology described in this application provides a meter group in two parts, namely a wedge as a base and a controlling and managing body, the two parts being connectable through connecting pliers and a bayonet joint.

20. Local interconnectability with external devices. The PLC communication system requires the availability of complex hardware and software means. In order to guarantee both the accessibility of the data contained in the concentrators and meters even by simple devices (e.g. handheld PCs) available to a user, and the availability of a second communication line substituting the network in case the latter is interrupted; an optical ZVEI gate is also associated to the meter. Said gate only requires the external device to have a simple RS-232 serial gate (available in almost every PC).

21. Safety/protection of the PLC communication. The data transferred from the concentrator to the meters or from the latter to the central server have different privacy degrees. For those not considered highly reserved, the protection mechanisms implemented by the functions managing the PLC communication protocol, apt to guarantee the delivery of the messages, is sufficient. For critical data, an additional mechanism has been added—e.g. based on an authentication key—at the level of message interpreting and managing procedure, apt to guarantee the non-modifiability and/or readability of said messages by third parties outside the service.

22. Automatic recognition of the installation of the meter. This function must be present for two reasons: one is technical, related to the PLC communication mechanisms, the other is fiscal, in order to detect potential fraud by users.

23. Distant meters reachability. The PLC communication method uses a physical support (electric line) that does not guarantee homogeneous conduction of the signal in every point of the network, for which reason meters may not be reachable by the concentrator. Therefore, the concentrator may require one or more meters (which are able "see" the non-reachable meter) to act as bridges, forwarding the message to the non-reachable meter. It is indeed a repetition mechanism, which allows to solve the problem of reachability via network.

24. Automatic recognition of the repetition path. When informed of the presence of a new meter, the concentrator checks its reachability. If it is not reachable, it tries to detect one or more different meters that can "see" the non-directly reachable meter. These meters are detected, the detecting parameters stored, and then subsequently used as an intermediate bridge.

25. Data maintenance in voltage drop conditions. The substitution of the mechanical devices recording the consumption (numbered knob) with electronic components (volatile memories) would imply the loss of the consumption data if the power from the providing company were interrupted. In order to avoid this, a non-volatile memory, preferably a ferro electric RAM (FRAM), has been used in the system, apt to guarantee the maintenance of the data throughout the useful life of the electricity meter (15 years).

26. Downloading the managing programmes. In order to guarantee the developing and/or corrective maintenance of the functions performed by the programs installed in the system devices, it is possible to modify said programs without interrupting the fundamental activities of said devices and without having to go where they are; the activity is performed using the PLC communication mechanisms used by the control centre to manage the devices.

27. Detection of the line switch opening. When one of the output lines from the power supply cabin—where the concentrator is—is out of order due to the opening of the line protection switch, the concentrator, on the basis of the failure to communicate with all the meters supplied by that line, indicates to the central server an out-of-service line alarm condition.

It is however understood that this list should not be intended as limiting. This description intends to highlight by way of examples how the main functions are distributed between the three components (meters, concentrators and central unit) of the system, considered the functional abilities of these three components, as better specified hereinafter and in the claims.

In other words, in order to achieve intelligence allocation, it is preferable that:

a) the meters be at least allocated at least one of the functions indicated at numbers 1), 5), 12) and 25); but also, preferably, the functions indicated at numbers 2), 3), 4), 6), 7) 12) 13), 16), 17) 18, 19), 20) and 25) are performed in the meters;

b) the meters be able to manage, together with the concentrators and the server, also at least one of the functions indicated at numbers 9), 14), 15), 21), 22), 23) and 26);

c) the concentrators be at least allocated at least one of the functions indicated at numbers 11) and 14), as well as those of PLC network master and TLC network node, but also, preferably, the functions indicated at numbers 20) and 24) are performed in concentrators;

d) the central server be at least allocated one or more of the functions indicated at numbers 8), 10), 17) and 26), but the function indicated at numbers 9) and 21) is also preferably performed in the central server, as well as the function, of course, of TLC network master, and other potential invoicing and managing functions (not concerning this patent application).

In other words, the intelligence of the system is distributed between the central unit, concentrators and meters so that each of these three elements of the system has its own processing ability, although limited as regards the meters, but sufficient in order to relevantly reduce the requirements of data transmission through bi-directional transmission; these requirements being limited, on the one hand, by the reduction of the quantity of transmitted data or, on the other hand, by the delay of their transmission to times when the transmission lines are less busy.

It is however understood that the technology described in this application should not be intended as limited to the particular arrangements illustrated above, which only represents example embodiments, but that also different alternatives are possible, without departing from the scope of the claims.

The invention claimed is:

1. System for the remote acquisition of data and for the remote control of the targets of users spread over a vast territory, comprising:

electricity meters including means to measure the electric energy consumptions and associated with each user, concentrators, each concentrator being connected to a set of meters by a first means for the bi-directional transmission of data, said concentrators being connected to a central control and supervision unit through a second means for the bi-directional transmission of data, wherein:

intelligence of the system is distributed between the central unit, the concentrators and the electricity meters;

each meter including means to transduce the measured energy consumption values into measuring data, a first processor to process said measuring data, a first memory, an output of said first processor being connected to said first memory via said first bi-directional transmission means so as to respectively at least temporarily store and/or transmit the processed measuring data processed by the first processor;

each concentrator includes a second microprocessor for further processing said data processed by the meters, a second memory to store the processed data issued by said meters and/or by said second microprocessor, an output of said second processor being connected to said second memory and/or to said second bi-directional transmission means, so as to respectively at least temporarily store and/or transmit said further processed data; and at least one of the concentrators is configured to identify a repeater path by detecting at least one meter functioning as an intermediate bridge to another meter to permit communication between the other meter and the one concentrator via the repeater path, wherein at least one of the concentrators is configured to generate a virtual image of at least one of the meters in the set and to update the virtual image based on energy consumption data from the first microprocessor or the first memory in the one meter, the virtual image being accessible by the central unit for determining information associated with the one meter.

2. System for the remote acquisition of data and for the remote control of the distributed targets of users, as in claim 1, wherein the at least one of the concentrators is configured to carry out an exchange of data between the virtual image of the at least one of the meters and the central unit.

3. System for the remote acquisition of data and for the remote control of the distributed targets of users, as in claim 2, wherein the at least one of the concentrators is configured to receive control information and/or program data from the central unit to update the virtual image of the at least one of the meters.

4. A data acquisition and control system, comprising:

multiple electricity meters distributed over a geographical area, each meter including first data processing circuitry for measuring electric energy consumption associated with an associated user and processing the measured consumption to provide energy consumption data, distributed multiple concentrators, each concentrator including second data processing circuitry for communicating with an associated set of meters including receiving and processing energy consumption data from the first data processing circuitry in each meter in the associated set, and a central unit for communicating with the concentrators and receiving the processed energy consumption data from the second processing circuitry in each concentrator, wherein at least one of the concentrators is configured to generate a virtual image of at least one of the meters in the associated set and to update the virtual image based on energy consumption data from the first data processing circuitry in the one meter, the virtual image being accessible by the central unit for determining information associated with the one meter.

5. The data acquisition and control system in claim 4, wherein the at least one of the concentrators is configured to carry out an exchange of data between the virtual image of the at least one of the meters and the central unit.

6. The data acquisition and control system in claim 5, wherein the at least one of the concentrators is configured to receive control information and/or program data from the central unit to update the virtual image of the at least one of the meters.

* * * * *